United States Patent
Juengling (12) 
(10) Patent No.: US 6,434,732 B2
(45) Date of Patent: *Aug. 13, 2002

(54) SEMICONDUCTOR CIRCUIT DESIGN METHODS EMPLOYING SPACING CONSTRAINTS

(75) Inventor: Werner Juengling, Boise, ID (US)

(73) Assignee: Micron Technology, Inc., Boise, ID (US)

(*) Notice: Subject to any disclaimer, the term of this patent is extended or adjusted under 35 U.S.C. 154(b) by 5 days.

This patent is subject to a terminal disclaimer.

(21) Appl. No.: 09/823,104

(22) Filed: Mar. 29, 2001

Related U.S. Application Data (63) Continuation of application No. 09/126,877, filed on Jul. 30, 1998, now Pat. No. 6,223,331.

(51) Int. Cl.[7] .............................. G06F 17/50; G06F 9/45
(52) U.S. Cl. ............................................. 716/10; 716/11
(58) Field of Search ...................................... 716/10, 11

(56) References Cited

U.S. PATENT DOCUMENTS

| 4,783,749 A | 11/1988 | Duzy et al. |
| 4,847,672 A | 7/1989 | Polhemus |
| 5,051,917 A | 9/1991 | Gould et al. |
| 5,541,434 A | * 7/1996 | Nicholls et al. ............ 257/383 |
| 5,666,288 A | 9/1997 | Jones et al. |
| 5,677,241 A | 10/1997 | Manning |
| 5,691,565 A | 11/1997 | Manning |
| 5,757,691 A | 5/1998 | Hatakeyama |
| 5,856,703 A | 1/1999 | Manning |
| 5,901,065 A | 5/1999 | Guruswamy et al. |
| 5,932,490 A | 8/1999 | Manning |
| 5,953,518 A | 9/1999 | Sugasawara et al. |
| 5,981,397 A | 11/1999 | Manning |
| 6,223,331 B1 | * 4/2001 | Juengling .................... 716/10 |
| 6,300,655 B1 | * 10/2001 | Ema et al. .................. 257/306 |

* cited by examiner

Primary Examiner—Matthew Smith
Assistant Examiner—A. M. Thompson
(74) Attorney, Agent, or Firm—Wells St. John P.S.

(57) ABSTRACT

Semiconductor circuit design methods, semiconductor processing methods, and related integrated circuitry are described. In one embodiment, a spacing constraint is defined and describes a desired spacing between a transistor gate line and a next adjacent structure. A circuit layout is defined to include a plurality of transistor gate lines. From the circuit layout, at least one area is determined wherein the spacing constraint is not met. The circuit layout is modified by defining in the one determined area, at least one added space-compensating structure which is laterally spaced from a gate line and a next adjacent structure where the spacing constraint is not met. In another embodiment, a plurality of gate lines are defined which are to be formed over substrate active areas. A determination is made whether a gate line spacing constraint is met wherein the gate line spacing constraint describes a desired spacing between a transistor gate line and a next adjacent transistor gate line. If the spacing constraint is not met, then a space-compensating transistor gate line is added and positioned to satisfy the spacing constraint.

17 Claims, 6 Drawing Sheets

SEMICONDUCTOR CIRCUIT DESIGN METHODS EMPLOYING SPACING CONSTRAINTS

CROSS REFERENCE TO RELATED APPLICATION

This patent application is a continuation application of U.S. patent application Ser. No. 09/126,877, filed on Jul. 30, 1998, now U.S. Pat. No. 6,223,331, entitled "Semiconductor Circuit Design Methods, Semiconductor Processing Methods and Integrated Circuitry," naming Werner Juengling as inventor.

TECHNICAL FIELD

This invention relates to semiconductor circuit design methods, to semiconductor processing methods and to integrated circuitry.

BACKGROUND OF THE INVENTION

Fabrication of integrated circuitry typically involves patterning and etching materials to form substrate features such as conductive lines. In many integrated circuitry applications, it is highly desirable to form conductive lines having standard or uniform conductive line widths, at least within a region of interest. Conductive line widths which vary between conductive lines can modify the conductive characteristics of the lines, and result in undesirable circuit performance. This problem can be of particular significance in the context of memory circuitry such as dynamic random access memory (DRAM) or static random access memory (SRAM) circuitry.

Figure 1:
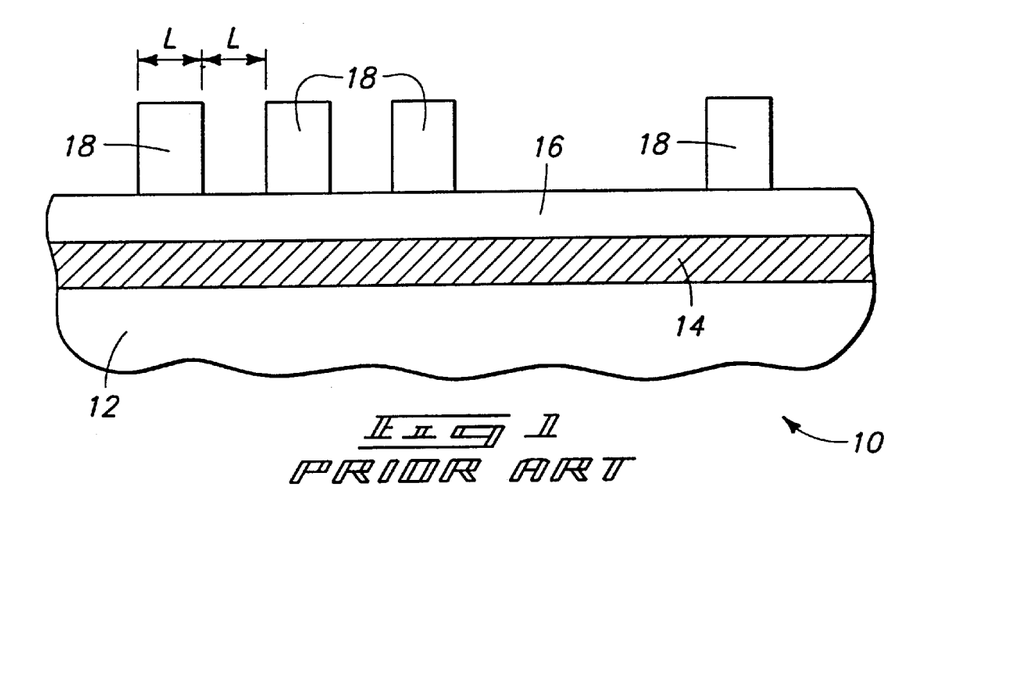
FIG. 1 is a diagrammatic side sectional view of a semiconductor wafer fragment in process in accordance with the prior art.
Figure 2:
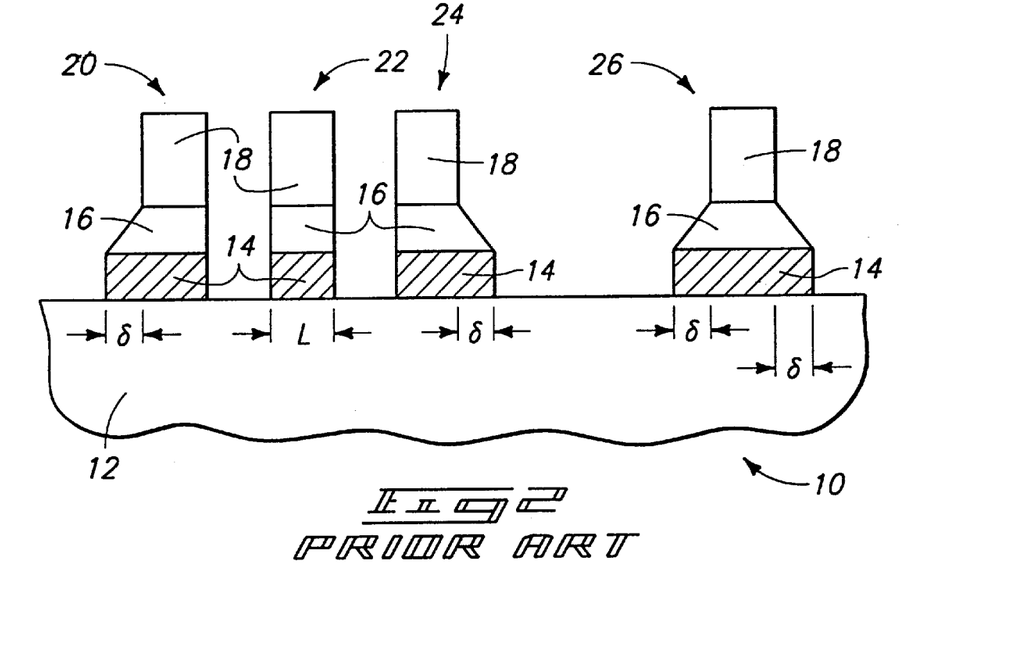
FIG. 2 is a view of the FIG. 1 wafer fragment at a processing step which is different from that which is shown in FIG. 1.

FIGS. 1 and 2 illustrate a typical processing scenario in which conductive lines having variable widths (and hence variable channel lengths) can be undesirably formed. Referring first to FIG. 1, a semiconductor wafer fragment 10 includes a semiconductive substrate 12. A conductive material layer 14 is formed over substrate 12 and an insulative material layer 16 is formed thereover. Conductive material layer 14 can comprise one or more conductive layers such as conductively doped polysilicon and/or a silicide, and insulative material layer 16 can comprise any suitable insulative material such as various nitrides and/or oxides.

A patterned masking layer 18 is formed over substrate 12 and defines a plurality of conductive lines which are to be subsequently etched from layers 14, 16. Each individual masking layer component has a generally uniform or constant length L which will be utilized to define, at least in part, the channel length/gate width of the subsequently etched conductive lines. In theory, the subsequent etching of the conductive lines from the patterned substrate of FIG. 1 should result in a series of conductive lines having a constant width or channel length. Such has not, however, been observed to occur with dry etching as L fell to and below 0.5 micron, as will become apparent from FIG. 2.

There, four conductive lines 20, 22, 24, and 26 have been etched from layers 14, 16. Yet, the conductive lines have variable widths and hence variable channel lengths in spite of having masking blocks 18 of the same dimension. Conductive lines 20 and 24 constitute "edge lines" which have no immediate conductive line neighbor on only one side thereof. Conductive line 22 comprises a "center line" which has immediate conductive line neighbors on each side thereof. Conductive line 26 comprises an "isolated line" which has no immediate conductive line neighbor on either side thereof.

Edge lines 20, 24 have widths which vary from center line 22 by a factor δ, thereby giving an effective channel length of L+δ. Isolated line 26 has a width, and hence a channel length, equal to around L+2δ. Conductive lines having immediately adjacent neighboring lines within a desired or selected distance, i.e. line 22, on each side thereof have generally uniform or standard widths and channel lengths. On the other hand, conductive lines which do not have immediately adjacent neighboring lines within a desired or selected distance on each side do not have standardized widths or channel lengths, i.e. lines 20, 24, and 26. Accordingly, it would be desirable to eliminate the variability of conductive line widths and hence channel lengths as described above.

This invention arose out of concerns associated with providing improved semiconductor design methods and processing methods directed to providing improved uniformity between conductive line widths and channel lengths.

SUMMARY OF THE INVENTION

Semiconductor circuit design methods, semiconductor processing methods, and related integrated circuitry are described. In one embodiment, a spacing constraint is defined and describes a desired spacing between a transistor gate line and a next adjacent structure. A circuit layout is defined to include a plurality of transistor gate lines. From the circuit layout, at least one area is determined wherein the spacing constraint is not met. The circuit layout is modified by defining in the one determined area, at least one added space-compensating structure which is laterally spaced from a gate line and a next adjacent structure where the spacing constraint is not met.

In another embodiment, a plurality of gate lines are defined which are to be formed over substrate active areas. A determination is made whether a gate line spacing constraint is met wherein the gate line spacing constraint describes a desired spacing between a transistor gate line and a next adjacent transistor gate line. If the spacing constraint is not met, then a space-compensating transistor gate line is added and positioned to satisfy the spacing constraint.

In yet another embodiment, a circuit layout having a memory area defining memory circuitry and a peripheral area defining peripheral circuitry is examined. From the circuit layout is ascertained areas in which retrofit structure patterns are to be added. The circuit layout is retrofitted within the peripheral area with retrofit structure patterns which ensure that desired spacing constraints are met with respect to at least some of the peripheral circuitry when the peripheral circuitry is subsequently patterned and etched.

In yet another embodiment, a semiconductor processing method includes forming a masking layer over a substrate defining a plurality of conductive lines which are to be etched. Some of the defined conductive lines constitute active gate lines positioned over substrate active areas, and other of the defined conductive lines constitute space-compensating conductive lines at least some of which having portions positioned over isolation oxide areas. Some of such other conductive lines are defined by the masking layer only to satisfy a spacing constraint which describes a desired active gate line-to-gate line spacing. Subsequently, the conductive lines are etched through the masking layer.

In yet another embodiment, a semiconductor processing method comprises forming a plurality of conductive lines over a substrate, some of the conductive lines providing transistor gate lines over substrate active areas, other of the conductive lines being formed only to satisfy a spacing constraint which describes a desired spacing between transistor gate lines.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 3:
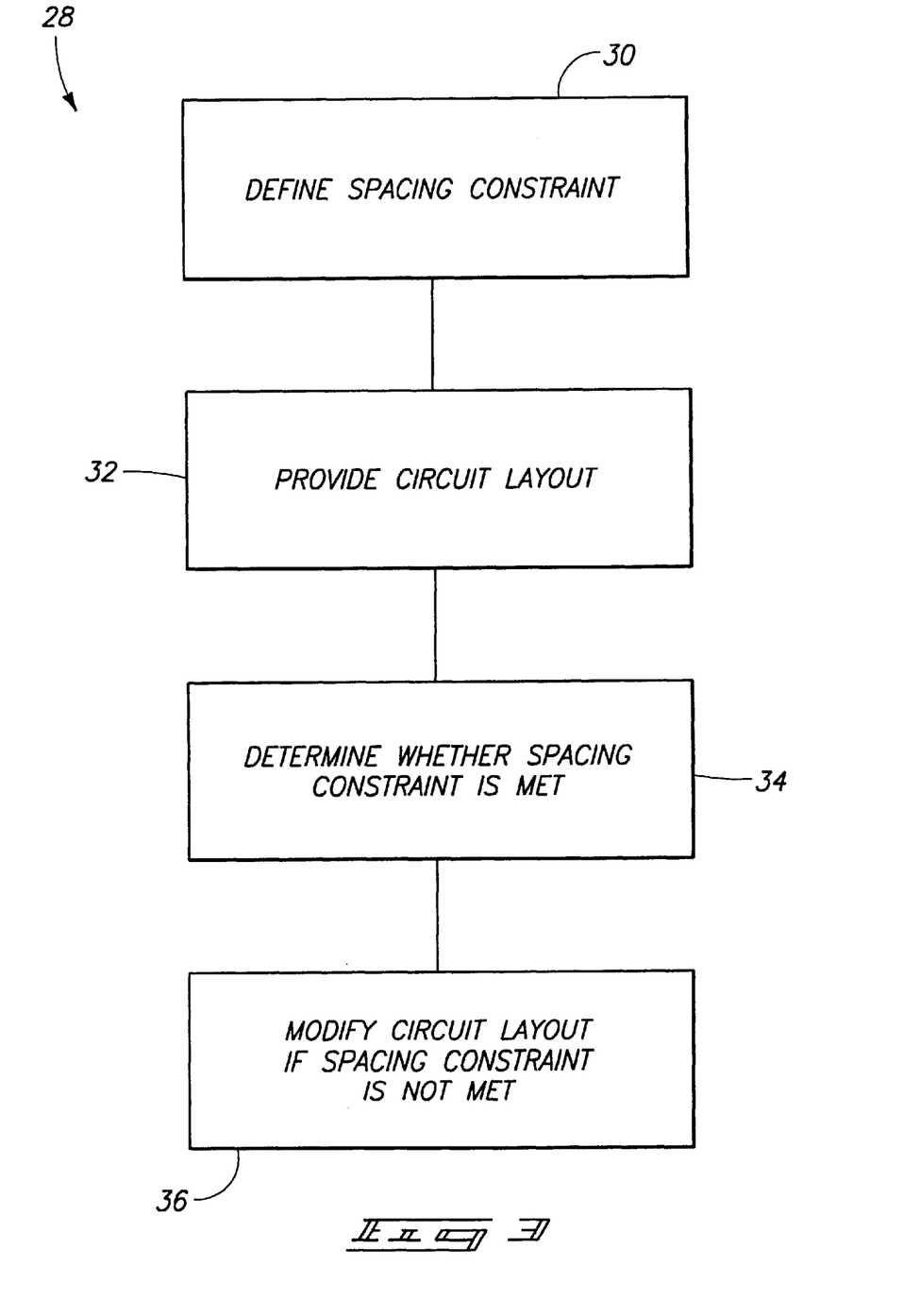
FIG. 3 is a flow diagram which depicts one processing method in connection with one embodiment of the invention.

Referring to FIG. 3, a semiconductor circuit design method is shown, in flow diagram form, generally at 28. A spacing constraint is first defined at 30, and describes a desired spacing between a transistor gate line and a next adjacent structure. In the context of this document, "spacing constraint" will be understood to include a desired or selected distance between a defined conductive line and a next adjacent structure which will yield, for the defined conductive line, a conductive line width which is within desired tolerances. An exemplary spacing constraint can be defined by the minimum photolithographic feature size or a selected range on either side thereof.

At 32, a circuit layout is provided which defines a plurality of transistor gate lines. An exemplary circuit layout is shown generally at 100 in FIG. 6. Layout 100 includes active areas 102, 104, 106, 108, 110, and 112. Active areas 102–112 are electrically isolated from one another by intervening isolation oxide or field oxide regions generally designated at 114. A plurality of transistor gate lines are defined over the active areas and include gate lines 116, 118, and 120 over active area 102; gate lines 122, 124 over active area 104; gate line 126 over active area 106; gate lines 128, 130 over active area 108; gate lines 132, 134, and 136 over active area 110; and gate lines 138, 140, and 142 over active area 112.

From circuit layout 100, at least one area is determined, at 34 (FIG. 3) wherein the spacing constraint is not met. In the FIG. 6 circuit layout, such areas are shown in dashed lines and indicated generally as areas A. For example, an area A is defined immediately above gate line 116 wherein the spacing constraint is not met. Similarly, another area A is defined immediately below the rightmost portion of gate line 118 where the spacing constraint is not met. Intermediate gate lines 120 and 122, an area A is defined where the spacing constraint is not met. Similarly, other areas are defined where the spacing constraint is not met.

At 36 (FIG. 3) the circuit layout is modified by defining in at least one of areas A, at least one added space-compensating structure which is laterally spaced from a gate line and a next adjacent structure where the spacing constraint is not met. Exemplary space-compensating structures can be seen in FIG. 8 at 144, 146, 148, 150, 152, 154, 156, 158, 160, and 162. The space-compensating structures are preferably disposed within areas A and satisfy or meet the spacing constraint which was not previously satisfied or met by the existing circuit layout.

Figure 8:
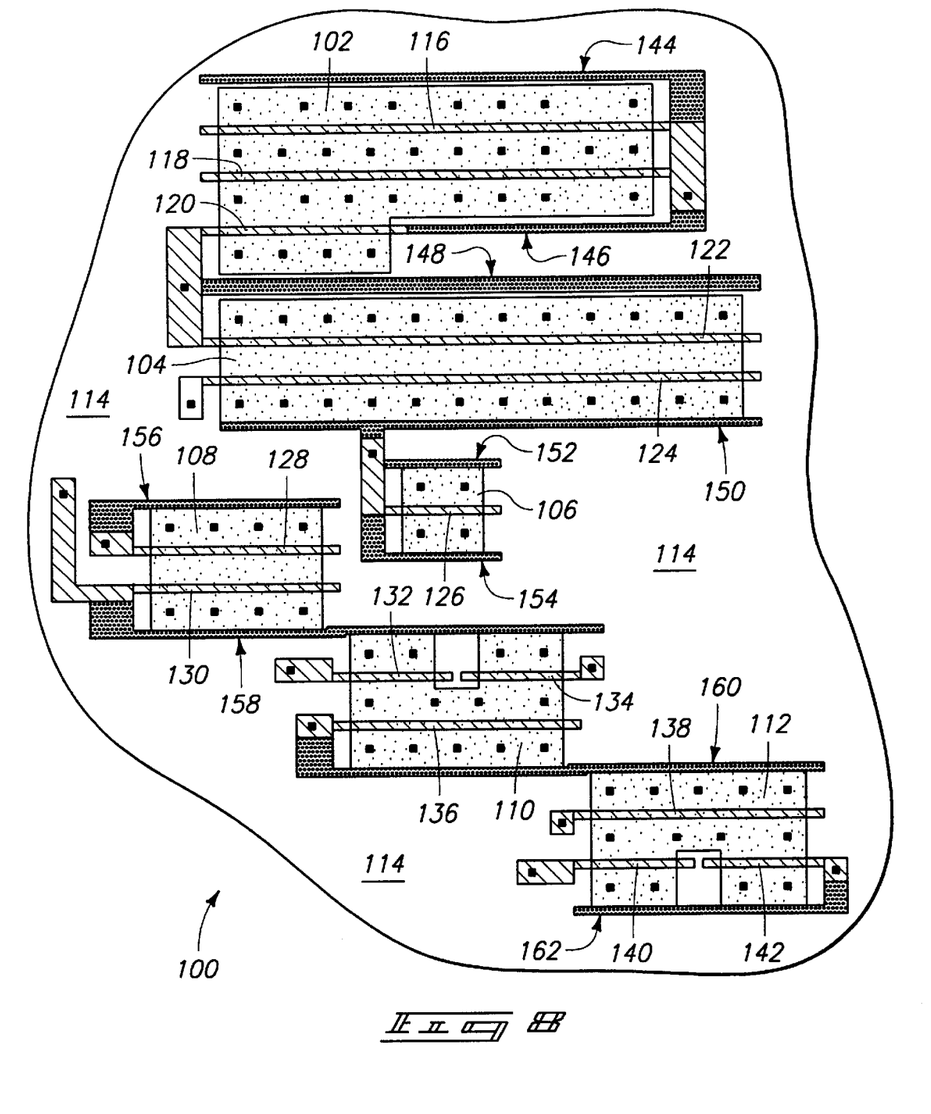
FIG. 8 is a view of the FIG. 6 circuit layout which has been modified in accordance with one embodiment of the present invention.

In one embodiment, the space-compensating structure comprises a conductive line which is formed within a corresponding area. In another embodiment, the space-compensating structure includes portions which will overly isolation oxide regions 114 within its associated area. In yet another embodiment, the space-compensating structures comprise conductive lines which are operably joined with one of the transistor gate lines. Such enables the added conductive lines to be maintained at a voltage potential which reduces undesirable effects which could be generated if such added gate lines were allowed to float relative to other conductive structures. The added gate lines can also be connected to a substrate potential which is typically negative one volt. In another embodiment, such gate lines can be grounded.

One important aspect of the above described methods provides for implementation of a rule by which a substantial portion of the transistor gate lines which do not have a nearest neighboring structure, e.g. conductive gate line, on each side thereof falling within the spacing constraint are provided with an added space-compensating structure which satisfies the spacing constraint. Subsequently, conductive lines which are etched from patterns generated by the circuit layout have gate line widths, and hence channel lengths, which are more desirably uniform in magnitude.

Figure 4:
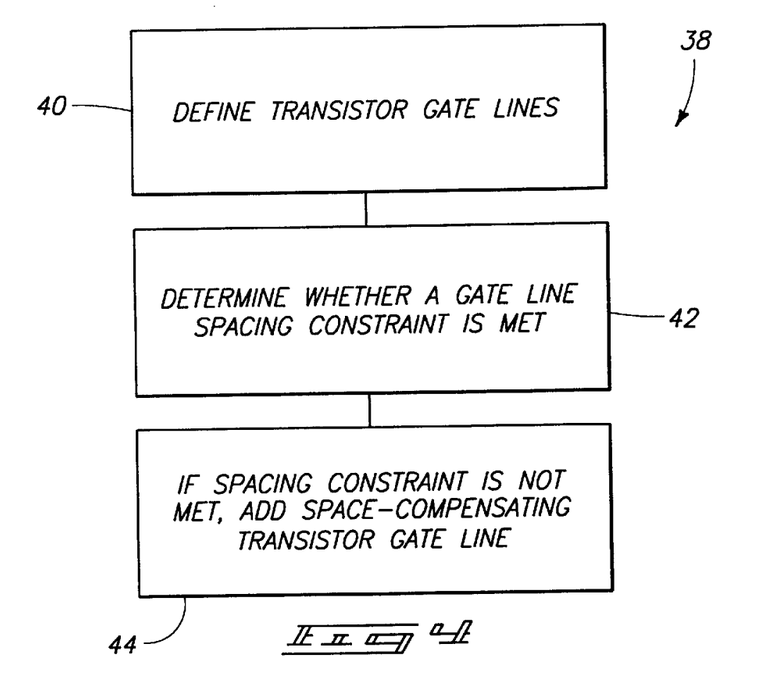
FIG. 4 is a flow diagram which depicts another processing method in connection with another embodiment of the invention.
Figure 6:
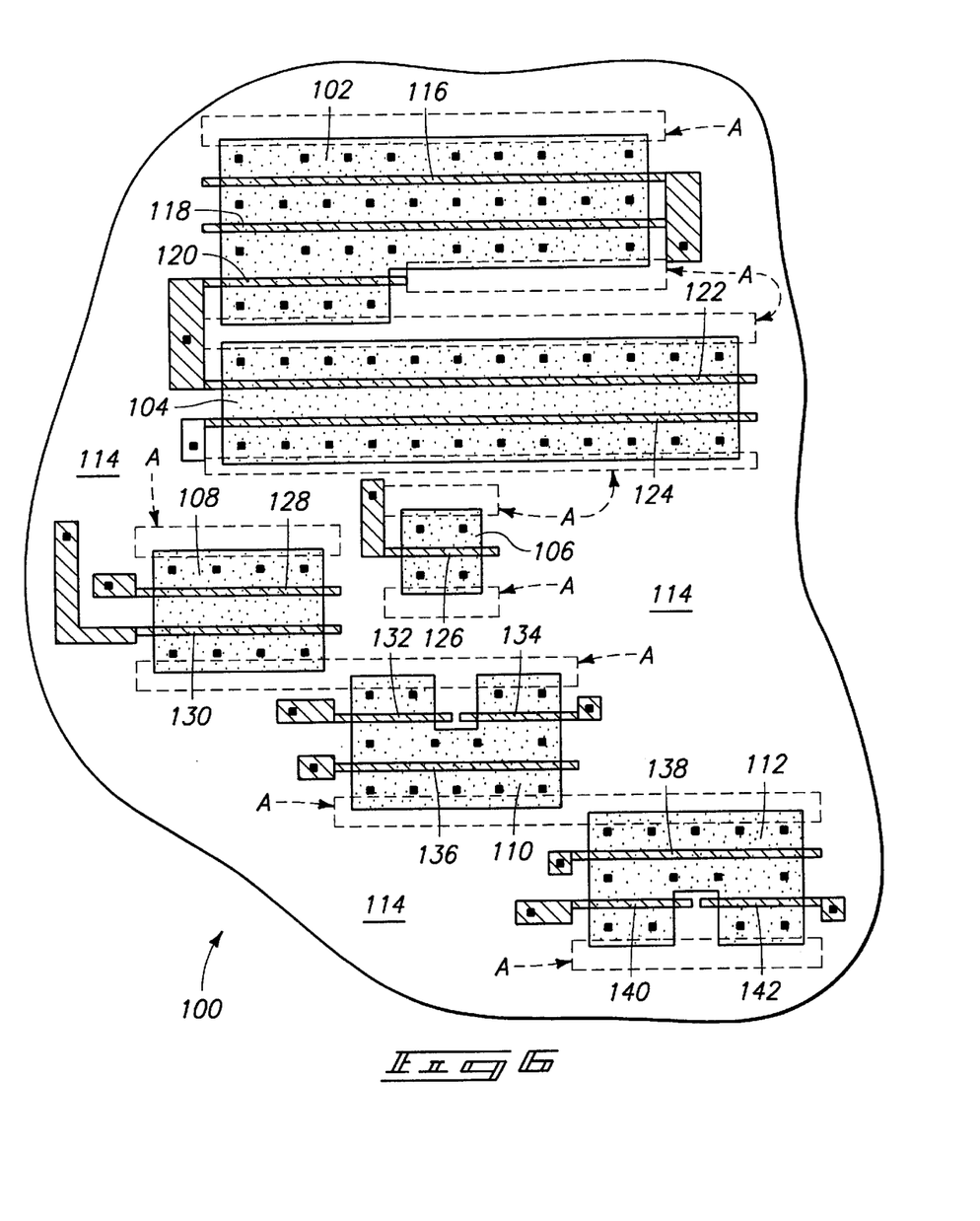
FIG. 6 is a top plan view of an exemplary circuit layout.

Referring to FIG. 4, a flow diagram is shown generally at 38 and describes another embodiment of the inventive methods. At 40, a plurality of transistor gate lines are defined which are to be formed over substrate active areas. Exemplary gate lines and active areas are shown in FIG. 6. At 42, a determination is made as to whether a gate line spacing constraint is met. The gate line spacing constraint describes a desired spacing between a transistor gate line and a next adjacent transistor gate line. At 44, if the spacing constraint is not met, a space-compensating transistor gate line is added and positioned to satisfy the spacing constraint. Exemplary space-compensating transistor gate lines are shown generally at 144–162 in FIG. 8.

In one embodiment, at least one, and preferably more of the space-compensating transistor gate lines are joined with one or more transistor gate lines which are to be formed over one or more substrate active areas. In another embodiment, the transistor gate lines which are to be formed over the substrate active areas, e.g. gate lines 116–142, have a generally uniform width, and the addition of the space-compensating transistor gate lines, e.g. gate lines 144–162, comprise forming such space-compensating transistor gate lines to have at least one width which is greater than the uniform width of transistor gate lines 116–142. For example, FIG. 8 shows a space-compensating transistor gate line 148 which has width which is greater than any of the illustrated transistor gate lines 116–142. Such enables gate lines 120, 122 to have their respective spacing constraints satisfied with only one structure. In yet another embodiment, one or more of the space-compensating transistor gate lines is added to overly isolation oxide regions 114.

In a preferred embodiment, the defining of the transistor gate lines (at 40 in FIG. 4) results in defining (a) isolated gate lines which would have no lateral neighboring transistor gate line within about 5 units, (b) defining edge gate lines which would have no neighboring lateral gate lines on one side within about 5 units, and (c) center gate lines which have lateral neighboring gate lines on each side within about 5 units. For purposes of this discussion, a "unit" will be understood to mean an integer number used for design purposes, which, when multiplied by a selected scaling factor value, yields a product which represents the actual spacing value. For example, using a scaling factor of 0.24 micron, the isolated gate lines would have no lateral neighboring transistor gate line within about 1.2 micron. Similarly, the edge gate lines would have no neighboring lateral gate lines on one side within about 1.2 micron, and the center gate lines would have lateral neighboring gate lines on each side within about 1.2 micron. Of course, as device dimensions continue to shrink, so too do the scaling factors which are used in designing the integrated circuitry.

For example, in FIG. 6, an exemplary isolated gate line is shown at 126. Exemplary edge gate lines are shown at 116, and 138. An exemplary center gate line is shown by the leftmost portion of gate line 118. Preferably, the addition of the space-compensating gate line comprises forming a sufficient number of the space-compensating transistor gate lines to effectively redefine some of the isolated gate lines and some of the edge gate lines as center gate lines. For example, and as shown in FIG. 8, isolated gate line 126 now has neighboring, space-compensating transistor gate lines 152, 154 thereby effectively transforming or redefining it as a center gate line. Similarly, edge gate line 116 now has space-compensating transistor gate line 144 which effectively redefines gate line 116 as a center gate line.

A desirable result of the redefinition of these edge and isolation lines is that subsequent formation of the lines over a substrate results in generally uniform conductive line widths and hence channel lengths, thereby adding to uniformity and predictability of operation of a finished integrated circuit.

Figure 5:
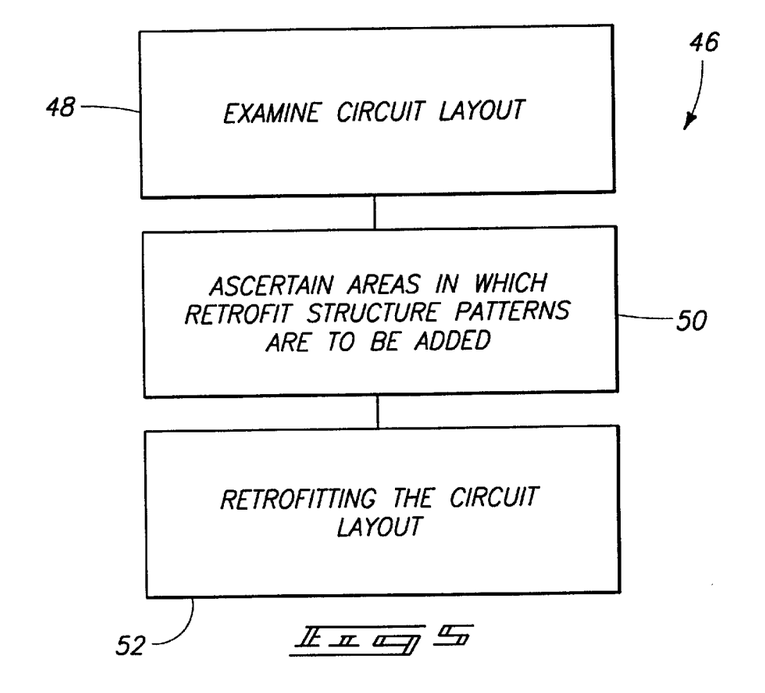
FIG. 5 is a flow diagram which depicts another processing method in connection with another embodiment of the invention.

Referring to FIG. 5, a flow diagram is shown generally at 46 and constitutes another embodiment of the present invention.

At 48, a circuit layout having a memory array defining memory circuitry which is to be formed, and a peripheral area defining peripheral circuitry which is to be formed is examined. An exemplary circuit layout is shown in FIG. 6 at 100. In the illustrated example, layout 100 constitutes a portion of a peripheral area in which peripheral circuitry is to be formed. Such can comprise peripheral circuitry of a DRAM, SRAM or other memory device. From circuit layout 100 is ascertained, at 50, areas in which so-called retrofit structure patterns are to be added. In a preferred embodiment, such retrofit structure patterns are to be added in at least some of areas A where desired spacing constraints are not met. At 52, circuit layout 100 within the peripheral area is retrofit with retrofit structure patterns. Exemplary retrofit structure patterns include the space-compensating structures 144–162 (FIG. 8), which ensure that desired spacing constraints are met with respect to at least some of the peripheral circuitry when the peripheral circuitry is subsequently patterned and etched over a substrate.

In one embodiment, the added retrofit structure patterns take the form of additional peripheral circuitry. In another embodiment, such retrofit structure patterns take the form of additional peripheral circuitry comprising conductive lines. In yet another embodiment, such retrofit structure patterns take the form of peripheral circuitry comprising conductive lines at least some of which are joined with individual respective peripheral circuitry conductive lines such as conductive line 120. In yet another embodiment, at least some of the retrofit structure patterns comprise additional conductive lines at least some of which have widths which are different from one another. For example, FIG. 8 shows retrofit structure pattern or conductive line 148 which has a width which is different, and in this example greater than, the conductive lines formed over the respective active areas.

In another embodiment, the peripheral circuitry comprises conductive lines having generally uniform conductive line widths. The retrofit structure patterns take the form of additional conductive lines at least some of which have widths which are different from the uniform conductive widths. In a further embodiment, the retrofit structure patterns take the form of additional conductive lines which are joined with and in electrical communication with associated peripheral circuitry conductive lines. For example, retrofit structure pattern 144 in FIG. 8 is in electrical communication with conductive line 116.

Figure 7:
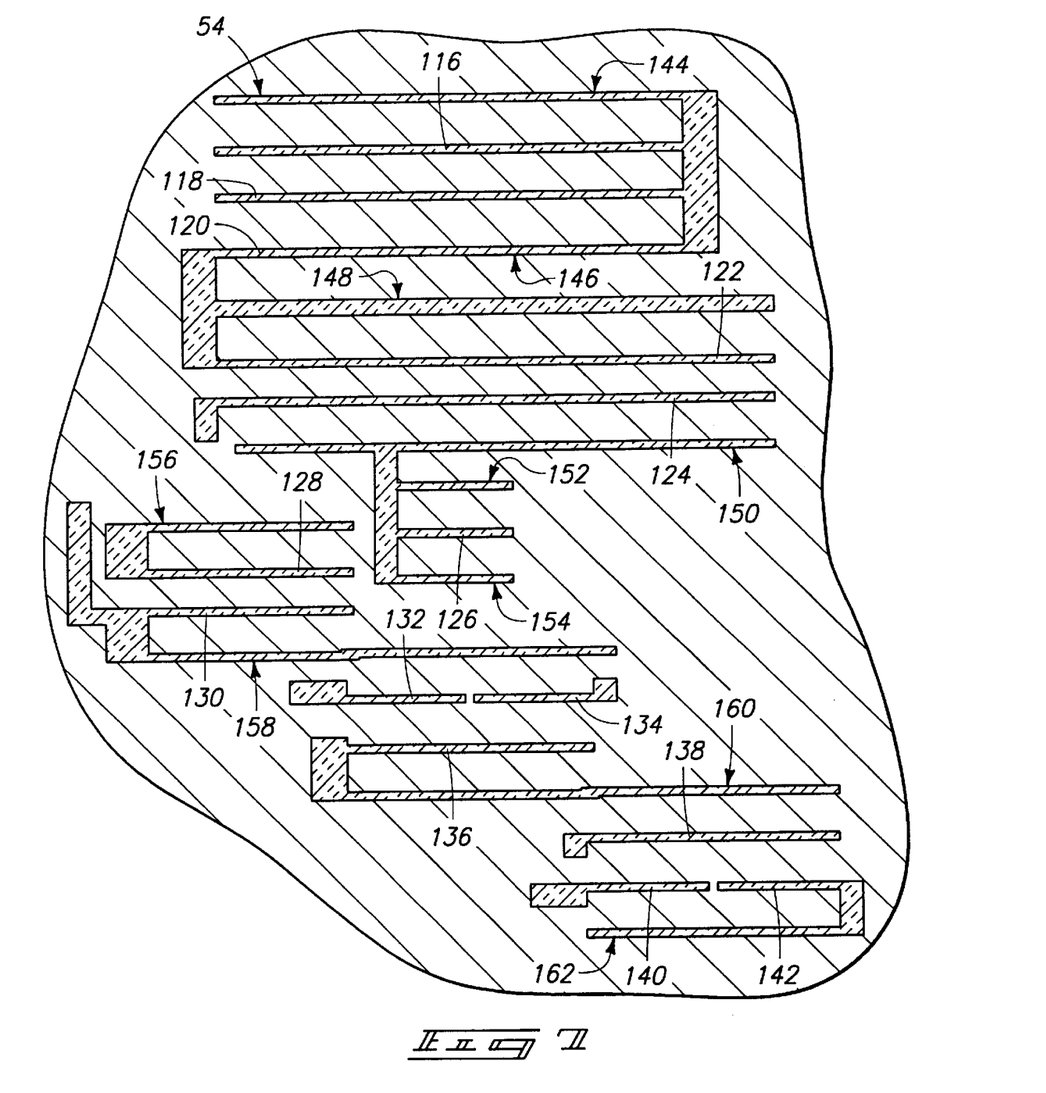
FIG. 7 is a view of the FIG. 6 layout at a processing step which is different from that which is shown in FIG. 6.

Referring to FIG. 7, and in accordance with another embodiment of the present invention, a masking layer 54 is formed over a substrate and defines a plurality of conductive lines which are to be etched. In this example, the masking layer takes the form of the structures which are set off by the dashed pairs of lines bounded on either side by solid lines. Some of the defined conductive lines constitute active gate lines which are positioned over substrate active areas such as active areas 102–112. Other of the defined conductive lines constitute space-compensating conductive lines at least some of which have portions positioned over isolation oxide areas 114. Such space-compensating conductive lines are defined by the masking layer, in this embodiment, only to satisfy a spacing constraint which describes a desired active gate line-to-gate line spacing.

Subsequently, the plurality of conductive lines are etched through the masking layer to give the integrated circuitry structure which is shown in layout form in FIG. 8. In a preferred embodiment, the masking layer is formed over a substrate having a memory array area and a peripheral area and the space-compensating conductive lines are defined only over the peripheral area. Of course, such space-compensating conductive lines can be defined over other areas.

In one embodiment, at least some of the space-compensating conductive lines are joined with the conductive lines defined over the substrate active areas. In another embodiment, the space-compensating conductive lines comprise at least one having a width which is different from another of the space-compensating conductive lines. For example, as shown in FIG. 8, space-compensating conductive line 148 has a width which is different from space-compensating conductive line 144.

Referring to FIG. 8, a plurality of conductive lines are formed over a substrate, with some of the conductive lines providing transistor gate lines over substrate active areas, and other of the conductive lines being formed only to satisfy a spacing constraint which describes a desired spacing between the transistor gate lines. In a preferred embodiment, the plurality of gate lines include some which are formed over substrate active areas, and others which are formed only over isolation oxide regions of a peripheral area of a substrate which supports both a memory array area and a peripheral area.

The present invention can provide methods and resultant structures through and in which generally uniform conductive line widths, and hence channel lengths are formed. In one embodiment, a plurality of conductive lines are formed over substrate active areas and comprise (a) edge lines which would have no immediate conductive line neighbor on only one side thereof within a selected distance, (b) isolated lines which would have no immediate conductive line neighbor on either side thereof within the selected distance, and (c) center lines which have immediate conductive line neighbors on each side thereof with the selected distance. For the edge lines and isolation lines, additional space-compensating structures are formed proximate some of the edge and isolated lines and spaced-apart from the side or sides, respectively, which would have no immediate conductive line neighbor. Preferably, the additional space-compensating structures are formed to have portions which are no further away from their associated edge or isolated line than the selected distance. In a preferred embodiment, the selected distance is from between about 4 to 6 units away (using 0.24 micron as the scaling factor), and the edge and isolated lines which have additional space-compensating structures there approximate have associated respective channel lengths which are substantially the same in magnitude as the channel lengths of the center lines.

In a preferred embodiment, the plurality of conductive lines are defined in a circuit layout such as that shown in FIG. 6. The definition of the additional space-compensating structures comprises modifying a circuit layout, as shown in FIG. 8, to include space-compensating structures which compensate for those lines which do not have an adjacent neighboring conductive line within the desired spacing.

Advantages achieved by the present invented methods and structures can include that generally uniform conductive line widths and hence channel lengths can be provided in integrated circuitry. Such can result in more standardization with respect to the operation of such circuitry. In addition, a plurality of integrated circuit devices can be manufactured in accordance with a design rule which provides for the addition of additional space-compensating structures within a predetermined distance laterally proximate individual transistor gate lines when there would not, otherwise, be a structure within the predetermined distance.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor circuit design method comprising:
providing a circuit layout comprising a plurality of adjacent structures;
defining a desired spacing constraint describing a desired spacing between the adjacent structures;
determining from the circuit layout at least one area wherein the desired spacing constraint is not met;
using the desired spacing constraint, defining at least one space- compensating structure; and
adding the at least one space-compensating structure to the at least one area, the at least one space-compensating structure being laterally spaced from adjacent ones of the plurality of adjacent structures to provide the desired spacing.

2. The method of claim 1, wherein determining at least one area comprises determining at least one area including at least one isolation oxide region.

3. The method of claim 2, wherein defining at least one space-compensating structure comprises defining the at least one space- compensating structure to have a portion configured to overlie the at least one isolation oxide region within the at least one area.

4. The method of claim 1, wherein providing the circuit layout comprising the plurality of structures and defining the at least one space-compensating structure comprise providing the plurality of structures and defining the at least one space-compensating structure to comprise conductive lines.

5. The method of claim 4, wherein at least one of the adjacent structures is a transistor gate line and defining the at least one space-compensating structure comprises defining a conductive line which operably joins with the transistor gate line.

6. A semiconductor circuit design method comprising:
defining at least one active area region of the semiconductor circuit;
defining a plurality of transistor gate lines which are to be formed over the at least one active area region;
defining a desired spacing constraint describing a desired spacing between adjacent transistor gate lines of the plurality of transistor gate lines;
determining whether the adjacent transistor gate lines meet the desired spacing constraint; and
where the desired spacing constraint is not met, adding a space- compensating structure positioned to satisfy the desired spacing constraint of the adjacent transistor gate lines.

7. The method of claim 6, wherein at least one transistor gate line of the plurality of transistor gate lines does not have an adjacent transistor gate line within the desired spacing constraint on one side of the one transistor gate line, and the at least one of the plurality of transistor gate line is provided with a space-compensating structure which satisfies the desired spacing constraint on the one side.

8. The method of claim 6, wherein the plurality of transistor gate lines which are to be formed over the at least one active area region are defined to have a generally uniform width at least within any one sub-region of the at least one active area region, and adding the space-compensating structure comprises forming the space-compensating structure to have a width which is greater than the generally uniform width at least within the any one sub-region.

9. The method of claim 6, wherein:
the defining of the plurality of transistor gate lines comprises:
defining at least one isolated transistor gate line which has no lateral neighboring transistor gate line within about 5 units;
defining at least one edge transistor gate line which has no neighboring lateral transistor gate line on one side within about 5 units; and defining at least one center transistor gate line which has lateral neighboring transistor gate line on each side within about 5 units, where "units" is defined as an integer number, which, when multiplied by a selected scaling factor value, yields a product representing an actual spacing value separating at least one of the lateral neighboring transistor gate lines from the at least one center transistor gate line; and wherein adding the space-compensating structure comprises forming at least one space-compensating structure to effectively redefine the at least one isolated transistor gate line and the at least one edge transistor gate line as center transistor gate lines.

10. The method of claim 6, wherein defining the plurality of transistor gate lines comprises:

defining at least one isolated transistor gate line which has no lateral neighboring transistor gate line within about 1.2 microns;

defining at least one edge transistor gate line which has no lateral neighboring transistor gate line on one side within about 1.2 microns; and defining at least one center transistor gate line which has a lateral neighboring transistor gate line on each side within about 1.2 microns; and wherein adding the space-compensating structure comprises forming at least one space-compensating structure to effectively redefine the at least one isolated transistor gate line and the at least one edge transistor gate line as center transistor gate lines.

11. A semiconductor circuit design method comprising:

providing a circuit layout having a first active area region and a second active area region, wherein the circuit layout defines memory circuitry to be formed in one of the active area regions and peripheral circuitry to be formed in another of the active area regions;

determining from the circuit layout, sub-regions in which at least one desired spacing constraint is not met;

defining layouts for space-compensating structures, the layouts for meeting the at least one desired spacing constraint; and modifying the circuit layout of that active area region within which the peripheral circuitry is to be formed by adding layouts for one or more space-compensating structures to ensure that the desired spacing constraints are met within that active area region when the peripheral circuitry is subsequently formed.

12. The method of claim 11, wherein the peripheral circuitry comprises conductive lines, and modifying the circuit layout by adding layouts for one or more space-compensating structures comprises adding layouts for conductive space-compensating structures to the circuit layout.

13. The method of claim 11, wherein the peripheral circuitry comprises conductive lines, and modifying the circuit layout comprises adding layouts for conductive space-compensating structures to the circuit layout, at least some of the conductive space-compensating structures joining with individual respective peripheral circuitry conductive lines.

14. The method of claim 11, wherein:

the peripheral circuitry comprises conductive lines; and modifying the circuit layout comprises adding layouts for space-compensating structures in the form of additional conductive lines at least some of which have widths which are different from one another.

15. The method of claim 11, wherein:

the peripheral circuitry comprises conductive lines having generally uniform conductive line widths; and modifying the circuit layout by adding layouts for one or more space-compensating structures comprises adding layouts for space-compensating structures in the form of additional conductive lines at least some of which have widths different from those of the generally uniform conductive line widths.

16. The method of claim 11, wherein:

the peripheral circuitry comprises conductive lines; and modifying the circuit layout comprises adding layouts for space-compensating structures in the form of additional conductive lines at least some of which have widths which are different from one another and are in electrical communication with at least one conductive line of the peripheral circuitry.

17. A semiconductor circuit design method comprising:

defining a selected distance, the selected distance determining whether or not adjacent structures of a semiconductor circuit are immediate neighbors;

defining a plurality of conductive lines of the semiconductor circuit, the plurality of conductive lines comprising (a) edge lines which have no immediate conductive line neighbor on only one side thereof, (b) isolated lines which have no immediate conductive line neighbor on either side thereof, and (c) center lines which have immediate conductive line neighbors on each side thereof, the center lines being defined to have generally uniform widths, which when etched form generally uniform associated channel lengths; and for the edge lines and isolated lines, defining one or more associated space-compensating structures and positioning the space-compensating structures proximate at least some of the edge and isolated lines and space-apart from the side or sides, respectively, which have no immediate conductive line neighbor, the positioning providing that when the edge lines and the isolated lines having associated space-compensating structures are etched, channel lengths for such edge lines and isolated lines are substantially the same as the generally uniform channel lengths of the center lines.

\* \* \* \* \*